(12) United States Patent
Nagaishi et al.

(10) Patent No.: US 10,546,668 B2
(45) Date of Patent: Jan. 28, 2020

(54) SUPERCONDUCTING WIRE

(71) Applicant: Sumitomo Electric Industries, Ltd., Osaka-shi, Osaka (JP)

(72) Inventors: Tatsuoki Nagaishi, Osaka (JP); Kotaro Ohki, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 16/345,318

(22) PCT Filed: May 19, 2017

(86) PCT No.: PCT/JP2017/011882
§ 371 (c)(1),
(2) Date: Apr. 26, 2019

(87) PCT Pub. No.: WO2018/083826
PCT Pub. Date: May 11, 2018

(65) Prior Publication Data
US 2019/0304634 A1    Oct. 3, 2019

(30) Foreign Application Priority Data
Nov. 1, 2016   (JP) ................................. 2016-214257

(51) Int. Cl.
*H01B 12/06*    (2006.01)
(52) U.S. Cl.
CPC ..................... *H01B 12/06* (2013.01)
(58) Field of Classification Search
CPC ......... H01B 12/00; H01B 12/06; H01B 12/02
See application file for complete search history.

(56) References Cited

U.S. PATENT DOCUMENTS

| | | | | |
|---|---|---|---|---|
| 2014/0066315 A1* | 3/2014 | Usoskin | ................. | H01L 39/16 505/230 |
| 2015/0332812 A1* | 11/2015 | Takemoto | ................. | H01F 6/06 505/230 |
| 2015/0357092 A1* | 12/2015 | Kurihara | ................. | H01F 6/06 505/230 |
| 2016/0155543 A1* | 6/2016 | Ko | ................. | H01L 39/2461 174/125.1 |
| 2016/0247608 A1* | 8/2016 | Choi | ................. | H01L 39/143 |
| 2016/0322132 A1* | 11/2016 | Kurihara | ................. | C23C 14/02 |
| 2016/0359097 A1* | 12/2016 | Kurihara | ................. | H01L 39/143 |
| 2017/0221609 A1* | 8/2017 | Kurihara | ................. | H01B 12/06 |

(Continued)

FOREIGN PATENT DOCUMENTS

| | | |
|---|---|---|
| JP | 2011-14404 A | 1/2011 |
| JP | 2012-156048 A | 8/2012 |

*Primary Examiner* — Hoa C Nguyen
*Assistant Examiner* — Amol H Patel
(74) *Attorney, Agent, or Firm* — Drinker Biddle & Reath LLP

(57) ABSTRACT

A superconducting wire includes a stack which includes: a first substrate having a first primary surface; a second substrate disposed opposite the first substrate; and a first superconducting material layer between the first primary surface and the second substrate. A ratio w/h of a width w of the superconducting wire to a height h of the superconducting wire in a cross section perpendicular to the longitudinal direction of the superconducting wire is 0.8 or greater and 10 or less. The width w is 2 mm or less.

15 Claims, 6 Drawing Sheets

(56) References Cited

U.S. PATENT DOCUMENTS

2017/0287598 A1* 10/2017 Adachi .............. C01F 17/0043
2017/0287599 A1* 10/2017 Kurihara ................ H01F 6/06
2019/0043644 A1*  2/2019 Ko ........................ H01B 1/02
2019/0131512 A1*  5/2019 Solovyov ............. H01B 12/06
2019/0172612 A1*  6/2019 Ohsugi ............... H01L 39/143

* cited by examiner

SUPERCONDUCTING WIRE

TECHNICAL FIELD

The present invention relates to a superconducting wire. The present application claims priority to Japanese Patent Application No. 2016-214257 filed on Nov. 1, 2016, the entire contents of which are hereby incorporated by reference.

BACKGROUND ART

A superconducting wire which includes a substrate and superconducting material layers on the substrate is known (see PTL 1).

CITATION LIST

Patent Literature

PTL 1: Japanese Patent Laying-Open No. 2012-156048

SUMMARY OF INVENTION

A superconducting wire according to one aspect of the present invention includes a stack which includes: a first substrate having a first primary surface; a second substrate disposed opposite the first substrate; and a first superconducting material layer between the first primary surface and the second substrate. A ratio w/h of a width w of the superconducting wire to a height h of the superconducting wire in a cross section perpendicular to the longitudinal direction of the superconducting wire is 0.8 or greater and 10 or less. The width w is 2 mm or less. The width w is defined as a maximum width of the superconducting wire in a first direction in which the first primary surface extends in the cross section. The height h is defined as a maximum height of the superconducting wire in a second direction perpendicular to the first direction in the cross section.

DETAILED DESCRIPTION

Figure 1:
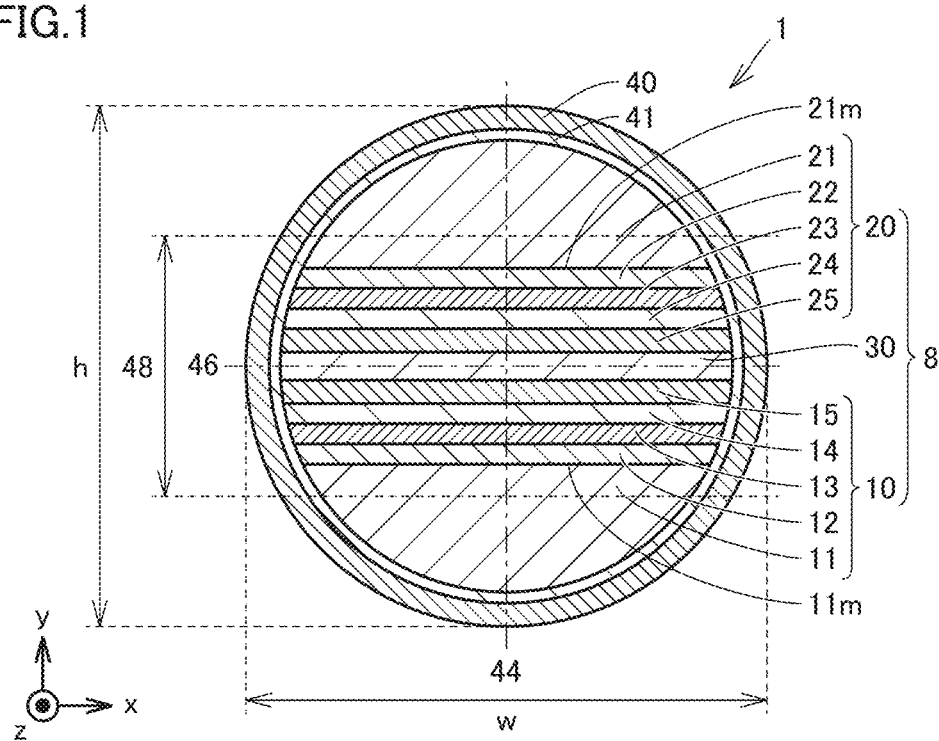
FIG. 1 is a schematic cross-sectional view of a superconducting wire according to Embodiment 1 in a cross section perpendicular to the longitudinal direction of the superconducting wire.

Problem to be Solved by the Present Disclosure

The superconducting wire disclosed in PTL 1 has a width about 40 times as long as the height of the superconducting wire. Thus, the superconducting wire is inferior in the handling. Moreover, the superconducting wire disclosed in PTL 1 has a width as wide as 5 mm. Thus, AC (alternating-current) loss is large in the superconducting wire. An object of one aspect of the present invention is to provide a superconducting wire that is easy to handle and has a low AC loss.

Advantageous Effect of the Present Disclosure

According to one aspect of the present invention, a superconducting wire that is easy to handle and has a low AC loss can be provided.

DESCRIPTION OF EMBODIMENTS

Initially, embodiments of the present invention will be described in a list.

(1) Superconducting wire 1, 2, 3, 4, 5 according to one aspect of the present invention includes a stack 8, 8b, 8c, 8d, 8e which includes: a first substrate 11 having a first primary surface 11m; a second substrate 21, 50 disposed opposite the first substrate 11; and a first superconducting material layer 13 between first primary surface 11m and second substrate 21, 50. A ratio w/h of a width w of superconducting wire 1, 2, 3, 4, 5 to a height h of superconducting wire 1, 2, 3, 4, 5 in a cross section (x-y plane) perpendicular to the longitudinal direction (z direction) of superconducting wire 1, 2, 3, 4, 5 is 0.8 or greater and 10 or less. Width w is 2 mm or less. Width w is defined as a maximum width of superconducting wire 1, 2, 3, 4, 5 in a first direction (x direction) in which first primary surface 11*m* extends in the cross section (x-y plane). Height h is defined as a maximum height of superconducting wire 1, 2, 3, 4, 5 in a second direction (y direction) perpendicular to the first direction (x direction) in the cross section (x-y plane).

Since ratio w/h of superconducting wire 1, 2, 3, 4, 5 is 0.8 or greater and 10 or less, the cross-sectional shape of superconducting wire 1, 2, 3, 4, 5 in the cross section (x-y plane) perpendicular to the longitudinal direction (z direction) of superconducting wire 1, 2, 3, 4, 5 has improved symmetry. Superconducting wire 1, 2, 3, 4, 5 that is easy to handle can be provided. Since superconducting wire 1, 2, 3, 4, 5 has width w of 2 mm or less, superconducting wire 1, 2, 3, 4, 5 that has low AC loss can be provided.

(2) Superconducting wire 1, 2, 3, 4, 5 according to (1) above has a maximum width in a central region 48 of superconducting wire 1, 2, 3, 4, 5 in the second direction (y direction). First superconducting material layer 13 is included in central region 48. Therefore, a ratio of a cross-sectional area of first superconducting material layer 13 to a cross-sectional area of superconducting wire 1, 2, 3, 4, 5 in the cross section (x-y plane) perpendicular to the longitudinal direction (z direction) of superconducting wire 1, 2, 3, 4, 5 is great. Superconducting wire 1, 2, 3, 4, 5 has a high critical current Ic.

(3) In superconducting wire 1, 2, 3, 4, 5 according to (1) or (2) above, stack 8, 8*b*, 8*c*, 8*d*, 8*e* further includes a conductive bonding layer 30 between first superconducting material layer 13 and second substrate 21, 50. Conductive bonding layer 30 serves as a bypass to which a current flow in first superconducting material layer 13 in a superconducting state commutates upon transition of first superconducting material layer 13 to a normal conducting state. Superconducting wire 1, 2, 3, 4, 5 can be prevented from being damaged upon the transition of first superconducting material layer 13 from the superconducting state to the normal conducting state.

(4) In superconducting wire 1, 3, 4, 5 according to any of (1) to (3) above, stack 8, 8*c*, 8*d*, 8*e* further includes a first stabilizing layer 15 between first superconducting material layer 13 and second substrate 21. First stabilizing layer 15 serves as a bypass to which a current flow in first superconducting material layer 13 in the superconducting state commutates upon the transition of first superconducting material layer 13 to the normal conducting state. Superconducting wire 1, 3, 4, 5 can be prevented from being damaged upon the transition of first superconducting material layer 13 from the superconducting state to the normal conducting state.

(5) In superconducting wire 1, 3, 4, 5 according to (1) above, second substrate 21 has a second primary surface 21*m* opposite the first primary surface 11*m*. Stack 8, 8*c*, 8*d*, 8*e* further includes a second superconducting material layer 23 between first primary surface 11*m* and second primary surface 21*m*. Therefore, the ratio of the cross-sectional area of the superconducting material layer (first superconducting material layer 13 and second superconducting material layer 23) to the cross-sectional area of superconducting wire 1, 3, 4, 5 in the cross section (x-y plane) perpendicular to the longitudinal direction (z direction) of superconducting wire 1, 3, 4, 5 is great. Superconducting wire 1, 3, 4, 5 has high critical current Ic. Since second superconducting material layer 23 is disposed between first primary surface 11*m* and second primary surface 21*m* opposite the first primary surface 11*m*, second superconducting material layer 23 is mechanically protected by first substrate 11 and second substrate 21.

(6) Superconducting wire 1, 3, 4, 5 according to (5) above has a maximum width in central region 48 of superconducting wire 1, 3, 4, 5 in the second direction (y direction). First superconducting material layer 13 and second superconducting material layer 23 are included in central region 48. Therefore, a ratio of the cross-sectional area of the superconducting material layer (first superconducting material layer 13 and second superconducting material layer 23) to the cross-sectional area of superconducting wire 1, 3, 4, 5 in the cross section (x-y plane) perpendicular to the longitudinal direction (z direction) of superconducting wire 1, 3, 4, 5 is great. Superconducting wire 1, 3, 4, 5 has high critical current Ic.

(7) In superconducting wire 1, 3, 4, 5 according to (5) or (6) above, stack 8, 8*c*, 8*d*, 8*e* further includes a conductive bonding layer 30 between first superconducting material layer 13 and second superconducting material layer 23. Conductive bonding layer 30 serves as a bypass to which a current flow in at least one of first superconducting material layer 13 and second superconducting material layer 23 in a superconducting state commutates upon transition of the at least one of first superconducting material layer 13 and second superconducting material layer 23 to a normal conducting state. Superconducting wire 1, 3, 4, 5 can be prevented from being damaged upon the transition of the at least one of first superconducting material layer 13 and second superconducting material layer 23 from the superconducting state to the normal conducting state.

(8) In superconducting wire 1, 3, 4, 5 according to any of (5) to (7) above, stack 8, 8*c*, 8*d*, 8*e* further includes a first stabilizing layer 15 between first superconducting material layer 13 and second superconducting material layer 23. First stabilizing layer 15 serves as a bypass to which the current flow in the at least one of first superconducting material layer 13 and second superconducting material layer 23 in the superconducting state commutates upon the transition of the at least one of first superconducting material layer 13 and second superconducting material layer 23 to the normal conducting state. Superconducting wire 1, 3, 4, 5 can be prevented from being damaged upon the transition of the at least one of first superconducting material layer 13 and second superconducting material layer 23 from the superconducting state to the normal conducting state.

(9) In superconducting wire 2 according to any of (1) to (4) above, second substrate 50 is a stabilizing substrate. Superconducting wire 2 can further be prevented from being damaged upon the transition of first superconducting material layer 13 from the superconducting state to the normal conducting state.

(10) Superconducting wire 1, 2, 3, 4, 5 according to any of (1) to (9) above further includes a second stabilizing layer 40 for covering the outer periphery of stack 8, 8*b*, 8*c*, 8*d*, 8*e*. Second stabilizing layer 40 serves as a bypass to which a current flow in at least one of first superconducting material layer 13 and second superconducting material layer 23 in a superconducting state commutates upon transition of the at least one of first superconducting material layer 13 and second superconducting material layer 23 to a normal conducting state. Superconducting wire 1, 2, 3, 4, 5 can be prevented from being damaged when the at least one of first superconducting material layer 13 and second superconducting material layer 23 transitions from the superconducting state to the normal conducting state.

(11) In superconducting wire 1, 2, 3, 4, 5 according to any of (1) to (10) above, ratio w/h is 0.9 or greater and 7 or less.

Width w is 1 mm or less. Superconducting wire 1, 2, 3, 4, 5 that is easy to handle and has a low AC loss can be provided.

(12) In superconducting wire 1, 2, 3, 4, 5 according to any of (1) to (10) above, ratio w/h is 1 or greater and 2 or less. Width w is 0.7 mm or less. Superconducting wire 1, 2, 3, 4, 5 that is easy to handle and has a low AC loss can be provided.

(13) In the cross section (x-y plane), superconducting wire 1, 2, 3, 4, 5 according to any of (1) to (12) has a shape that is line symmetric about a first centerline 44 of superconducting wire 1, 2, 3, 4, 5 in the first direction (x direction) and line symmetric about a second centerline 46 of superconducting wire 1, 2, 3, 4, 5 in the second direction (y direction). Superconducting wire 1, 2, 3, 4, 5 that is easy to handle and has a low AC loss can be provided.

(14) Superconducting wire 1, 2, 3, 4, 5 according to any of (1) to (13) above has any of a round shape, an oval shape, and a polygonal shape in the cross section (x-y plane). Superconducting wire 1, 2, 3, 4, 5 that is easy to handle and has a low AC loss can be provided.

(15) Superconducting wire 1, 2, 3, 4, 5 according to any of (1) to (13) above has any of a round shape, a square shape, a rhombus shape, and a regular hexagonal shape. Superconducting wire 1, 2, 3, 4, 5 that is easy to handle and has a low AC loss can be provided.

DETAILS OF EMBODIMENTS OF THE PRESENT INVENTION

Next, the embodiments of the present invention will be described in detail with reference to the accompanying drawings. Note that in the following drawings, like reference numbers refer to like or corresponding parts, and the description thereof will not be repeated. At least some of configurations according to the embodiments described below may be combined arbitrary.

Embodiment 1

As shown in FIG. 1, a superconducting wire 1 according to the present embodiment mainly includes a stack 8 which includes: a first substrate 11 having a first primary surface 11m; a second substrate 21 disposed opposite the first substrate 11; and a first superconducting material layer 13 between first primary surface 11m and second substrate 21. Superconducting wire 1 may further include a second stabilizing layer 40 for covering the outer periphery of stack 8, and an underlying layer 41 between stack 8 and second stabilizing layer 40.

Stack 8 may further include a first intermediate layer 12, a first protective layer 14, a first stabilizing layer 15, a second intermediate layer 22, a second superconducting material layer 23, a second protective layer 24, a third stabilizing layer 25, and a conductive bonding layer 30. Specifically, stack 8 according to the present embodiment includes a first superconducting wire portion 10, a second superconducting wire portion 20, and a conductive bonding layer 30 between first superconducting wire portion 10 and second superconducting wire portion 20. First superconducting wire portion 10 includes first substrate 11, first intermediate layer 12, first superconducting material layer 13, and first protective layer 14. First superconducting wire portion 10 may further include first stabilizing layer 15. Second superconducting wire portion 20 includes second substrate 21, second intermediate layer 22, second superconducting material layer 23, and second protective layer 24. Second superconducting wire portion 20 may further include third stabilizing layer 25.

First substrate 11 and second substrate 21 may be metal substrates. Particularly, first substrate 11 and second substrate 21 may be textured metal substrates. The textured metal substrate refers to a substrate whose crystal orientation is aligned in two directions (x direction and z direction) within first primary surface 11m and second primary surface 21m of second substrate 21. The textured metal substrate may be a clad-type metal substrate where, for example, a nickel layer and a copper layer are disposed on a SUS or Hastelloy (registered trademark) base substrate. Materials for first substrate 11 and second substrate 21 are not limited thereto, and may be materials other than metals.

First substrate 11 and second substrate 21 each have a thickness greater than other components (first intermediate layer 12, first superconducting material layer 13, first protective layer 14, first stabilizing layer 15, second intermediate layer 22, second superconducting material layer 23, second protective layer 24, and third stabilizing layer 25) included in first superconducting wire portion 10 and second superconducting wire portion 20. The thickness of each of first substrate 11 and second substrate 21 may be, but not particularly limited to, 30 μm or greater, and particularly 50 μm or greater. Considering the productivity and cost of first substrate 11 and second substrate 21, first substrate 11 and second substrate 21 each may have a thickness of 1 mm or less, and particularly 200 μm or less. The thickness of first substrate 11 is defined as a maximum height of first substrate 11 in a second direction (y direction) parallel to a normal of first primary surface 11m in a cross section (x-y plane) perpendicular to the longitudinal direction (z direction) of superconducting wire 1. The thickness of second substrate 21 is defined as a maximum height of second substrate 21 in the second direction (y direction) parallel to a normal of second primary surface 21m in the cross section (x-y plane) perpendicular to the longitudinal direction (z direction) of superconducting wire 1.

First intermediate layer 12 is provided on first primary surface 11m of first substrate 11. First intermediate layer 12 is disposed between first substrate 11 and first superconducting material layer 13. A material can be employed for first intermediate layer 12, which has an extremely low reactivity with first superconducting material layer 13 and prevents reduction in superconducting characteristics of first superconducting material layer 13. First intermediate layer 12 can inhibit diffusion of metal atoms from first substrate 11 into first superconducting material layer 13 when forming first superconducting material layer 13 using a high temperature process. When first substrate 11 has crystal orientation on the surface, first intermediate layer 12 may mitigate the difference in crystal orientation between first substrate 11 and first superconducting material layer 13. First intermediate layer 12 may have a thickness of, for example, 0.1 μm or greater and 3.0 μm or less.

Second intermediate layer 22 is provided on second primary surface 21m of second substrate 21. Second intermediate layer 22 is disposed between second substrate 21 and second superconducting material layer 23. A material can be employed for second intermediate layer 22, which has an extremely low reactivity with second superconducting material layer 23 and prevents reduction in superconducting characteristics of second superconducting material layer 23. Second intermediate layer 22 can inhibit diffusion of metal atoms from second substrate 21 into second superconducting material layer 23 when forming second superconducting material layer 23 using a high temperature process. When second substrate 21 has crystal orientation on the surface, second intermediate layer 22 may mitigate the difference in crystal orientation between second substrate 21 and second superconducting material layer 23. Second intermediate layer 22 may have a thickness of, for example, 0.1 μm or greater and 3.0 μm or less.

First intermediate layer 12 and second intermediate layer 22 may be composed of at least one of, for example, YSZ (yttria-stabilized zirconia), $CeO_2$ (cerium oxide), MgO (magnesium oxide), $Y_2O_3$ (yttrium oxide), $Al_2O_3$ (aluminum oxide), $LaMnO_3$ (lanthanum manganese oxide), $Gd_2Zr_2O_7$ (gadolinium zirconate), and $SrTiO_3$ (strontium titanate). First intermediate layer 12 and second intermediate layer 22 each may be composed of multiple layers. When first intermediate layer 12 and second intermediate layer 22 are each composed of multiple layers, the multiple layers may be composed of different materials, or some of the multiple layers may be composed of the same material and the rest may be composed of different materials. When a SUS substrate or a Hastelloy substrate is used as first substrate 11 and second substrate 21, first intermediate layer 12 and second intermediate layer 22 may be crystal alignment layers formed by IBAD (Ion Beam Assisted Deposition), for example.

First superconducting material layer 13 may be provided on a primary surface, of first intermediate layer 12, opposite a primary surface facing the first substrate 11. First superconducting material layer 13 may be provided on first primary surface 11m of first substrate 11 with first intermediate layer 12 inbetween. First superconducting material layer 13 may be provided between first primary surface 11m and second primary surface 21m. Second superconducting material layer 23 may be provided on a primary surface, of second intermediate layer 22, opposite a primary surface facing second substrate 21. Second superconducting material layer 23 may be provided above second primary surface 21m of second substrate 21 with second intermediate layer 22 inbetween. Second superconducting material layer 23 may be provided between first primary surface 11m and second primary surface 21m. First superconducting material layer 13 and second superconducting material layer 23 are portions of superconducting wire 1 through which a supercurrent flows.

Preferably, the superconductive materials making up first superconducting material layer 13 and second superconducting material layer 23 are, but not particularly limited to, RE-123-based oxide superconductors, for example. The RE-123-based oxide superconductors refer to superconductors represented by $REBa_2Cu_3O_y$, where y is 6 to 8, more preferably 6.8 to 7, and RE refers to yttrium or a rare-earth element such as Gd, Sm, and Ho.

The thickness of each of first superconducting material layer 13 and second superconducting material layer 23 may be, but not particularly limited to, 0.5 μm or greater, and particularly 1.0 μm or greater, to increase a critical current $I_c$ of the supercurrent flow in each of first superconducting material layer 13 and second superconducting material layer 23. Considering the productivity of first superconducting material layer 13 and second superconducting material layer 23, the thickness of each of first superconducting material layer 13 and second superconducting material layer 23 may be 10 μm or less, and particularly 5 μm or less. First superconducting material layer 13 and second superconducting material layer 23 each may have a thickness greater than first intermediate layer 12 and second intermediate layer 22.

First protective layer 14 is formed on a primary surface, of first superconducting material layer 13, opposite a primary surface facing first intermediate layer 12. First protective layer 14 is disposed between first superconducting material layer 13 and first stabilizing layer 15. Second protective layer 24 is formed on a primary surface, of second superconducting material layer 23, opposite a primary surface facing second intermediate layer 22. Second protective layer 24 is disposed between second superconducting material layer 23 and third stabilizing layer 25.

First protective layer 14 and second protective layer 24 each may be composed of a conductive material. First protective layer 14 and second protective layer 24 each may be composed of silver (Ag) or a silver alloy, for example. The thickness of each of first protective layer 14 and second protective layer 24 may be, but to particularly limited to, for example, 0.1 μm or greater, and particularly 1 μm or greater. The thickness of each of first protective layer 14 and second protective layer 24 may be, for example, 20 μm or less, and particularly 10 μm or less.

First protective layer 14 may be provided on a side face (y-z plane) of first superconducting material layer 13. First protective layer 14 may further be provided on a side face (y-z plane) of first intermediate layer 12. Second protective layer 24 may be provided on a side face (y-z plane) of second superconducting material layer 23. Second protective layer 24 may further be provided on a side face (y-z plane) of second intermediate layer 22.

First stabilizing layer 15 may be provided on first protective layer 14. First stabilizing layer 15 may be formed on a primary surface, of first protective layer 14, opposite a primary surface facing first superconducting material layer 13. Third stabilizing layer 25 may be provided on second protective layer 24. Third stabilizing layer 25 may be formed on a primary surface, of second protective layer 24, opposite a primary surface facing second superconducting material layer 23.

First stabilizing layer 15 and third stabilizing layer 25, along with first protective layer 14 and second protective layer 24, serve as bypasses to which a current flow in at least one of first superconducting material layer 13 and second superconducting material layer 23 in the superconducting state commutates upon transition of the at least one of first superconducting material layer 13 and second superconducting material layer 23 to the normal conducting state. First stabilizing layer 15 and third stabilizing layer 25 are each made of a metal foil or plating layer that has good electrical conductivity. Preferably, the materials comprising first stabilizing layer 15 and third stabilizing layer 25 are copper (Cu) or a copper alloy, for example. First stabilizing layer 15 and third stabilizing layer 25 each may have a thickness of, but not particularly limited to, 10 μm or greater, and particularly 20 μm or greater. First stabilizing layer 15 and third stabilizing layer 25 each may have a thickness of 100 μm or less, and particularly 50 μm or less. The thickness of each of first stabilizing layer 15 and third stabilizing layer 25 are greater than first protective layer 14 and second protective layer 24.

Conductive bonding layer 30 joins second superconducting wire portion 20 to first superconducting wire portion 10. Second superconducting wire portion 20 may be joined to first superconducting wire portion 10 so that second primary surface 21m of second substrate 21 faces opposite the first primary surface 11m of first substrate 11. Second superconducting wire portion 20 may be joined to first superconducting wire portion 10 so that second superconducting material layer 23 faces opposite the first superconducting material layer 13. Conductive bonding layer 30 serves as a bypass to which a current flow in at least one of first superconducting material layer 13 and second superconducting material layer 23 in the superconducting state commutates upon transition of the at least one of first superconducting material layer 13 and second superconducting material layer 23 to the normal conducting state. The material of conductive bonding layer 30 may be, but not particularly limited to, a solder, for example. Conductive bonding layer 30 may have a thickness of, for example, 1 μm or greater, and particularly 10 μm or greater. Conductive bonding layer 30 may have a thickness of, but not particularly limited to, 100 μm or less, and particularly 50 μm or less, for example.

Second stabilizing layer 40 covers the outer periphery of stack 8. Second stabilizing layer 40 covering the outer periphery of stack 8 includes forming the second stabilizing layer 40 directly on the outer periphery of stack 8 and forming the second stabilizing layer 40 on the outer periphery of stack 8 via the underlying layer 41. Second stabilizing layer 40 serves as a bypass to which a current flow in at least one of first superconducting material layer 13 and second superconducting material layer 23 in the superconducting state commutates upon transition of the at least one of first superconducting material layer 13 and second superconducting material layer 23 to the normal conducting state. Second stabilizing layer 40 is made of a metal foil or plating layer that has good electrical conductivity. Preferably, the material comprising the second stabilizing layer 40 is copper (Cu) or a copper alloy, for example. Second stabilizing layer 40 may have a thickness of, but not particularly limited to 10 μm or greater, or may be 15 μm or greater. Second stabilizing layer 40 may have a thickness of for example, 500 μm or less, or may be 200 μm or less.

Underlying layer 41 is provided on the outer surface, of first substrate 11, opposite the first primary surface 11m, and on the outer surface, of second substrate 21, opposite the first primary surface 11m. Underlying layer 41 provides improved adhesion of the second stabilizing layer 40 to first substrate 11 and second substrate 21.

Underlying layer 41 may further be provided on the side face (y-z plane) of first superconducting material layer 13 and on the side face (y-z plane) of second superconducting material layer 23. Underlying layer 41 may further be provided on the side face (y-z plane) of first intermediate layer 12 and on the side face (y-z plane) of second intermediate layer 22. As with first protective layer 14 and second protective layer 24, underlying layer 41 may be composed of a conductive material. Underlying layer 41 may be composed of, for example, silver (Ag) or a silver alloy. Underlying layer 41 may have a thickness of, for example, 0.1 μm or greater and 10 μm or less, or may be 1 μm or greater and 5 μm or less.

Superconducting wire 1 is a long wire extending in the longitudinal direction (z direction). The length of superconducting wire 1 in the longitudinal direction (z direction) is far greater than height h and width w of superconducting wire 1. The length of superconducting wire 1 in the longitudinal direction (z direction) may be, for example, 1 m or longer, particularly 100 m or longer, and more particularly 1 km or longer. In the present application, width w of superconducting wire 1 is defined as a maximum width of superconducting wire 1 in a first direction (x direction) in which first primary surface 11m extends in the cross section (x-y plane) perpendicular to the longitudinal direction (z direction) of superconducting wire 1. In the present application, height h of superconducting wire 1 is defined as a maximum height of superconducting wire 1 in the second direction (y direction) perpendicular to the first direction (x direction) in the cross section (x-y plane) perpendicular to the longitudinal direction (z direction) of superconducting wire 1.

Ratio w/h of width w of superconducting wire 1 to height h in the cross section (x-y plane) perpendicular to the longitudinal direction (z direction) of superconducting wire 1 is 0.8 or greater and 10 or less. Ratio w/h may be 0.9 greater, or may be 1 or greater. Ratio w/h may be 7 or less, 5 or less, 4 or less, 3 or less, or 2 or less.

The ratio of the width of stack 8 to the height in the cross section (x-y plane) perpendicular to the longitudinal direction (z direction) of superconducting wire 1 is 0.8 or greater and 10 or less. The ratio of the width of stack 8 to the height may be 0.9 or greater, or may be 1 or greater. The ratio of the width of stack 8 to the height may be 7 or less, 5 or less, 4 or less, 3 or less, or 2 or less. In the present application, the width of stack 8 is defined as a maximum width of stack 8 in the first direction (x direction) in which first primary surface 11m extends in the cross section (x-y plane) perpendicular to the longitudinal direction (z direction) of superconducting wire 1. In the present application, the height of stack 8 is defined as a maximum height of stack 8 in the second direction (y direction) perpendicular to the first direction (x direction) in the cross section (x-y plane) perpendicular to the longitudinal direction (z direction) of superconducting wire 1.

In the cross section (x-y plane) perpendicular to the longitudinal direction (z direction) of superconducting wire 1, superconducting wire 1 has a shape which is line symmetric about a first centerline 44 of superconducting wire 1 in the first direction (x direction) and line symmetric about a second centerline 46 of superconducting wire 1 in the second direction (y direction). In the present specification, the cross-sectional shape of superconducting wire 1, which is line symmetric about the centerline (44, 46) in the cross section (x-y plane) perpendicular to the longitudinal direction (z direction) of superconducting wire 1, refers to a cross-sectional shape of superconducting wire 1 (the shape of superconducting wire 1 in the cross section (x-y plane)) in which 90% or more of the cross-sectional area of superconducting wire 1 overlaps when folded on the centerline (44, 46).

In the cross section (x-y plane) perpendicular to the longitudinal direction (z direction) of superconducting wire 1, stack 8 has a shape which is line symmetric about the first centerline 44 of superconducting wire 1 in the first direction (x direction) and line symmetric about the second centerline 46 of superconducting wire 1 in the second direction (y direction). In the present specification, the cross-sectional shape of stack 8, which is line symmetric about the centerline (44, 46) in the cross section (x-y plane) perpendicular to the longitudinal direction (z direction) of superconducting wire 1, refers to a cross-sectional shape of stack 8 (the shape of superconducting wire 1 in the cross section (x-y plane)) in which 90% or more of the cross-sectional area of stack 8 overlaps when the cross-sectional shape is folded on the centerline (44, 46).

Superconducting wire 1 has a round shape in the cross section (x-y plane) perpendicular to the longitudinal direction (z direction) of superconducting wire 1. Stack 8 has a round shape in the cross section (x-y plane) perpendicular to the longitudinal direction (z direction) of superconducting wire 1. Superconducting wire 1 may have an oval shape in the cross section (x-y plane) perpendicular to the longitudinal direction (z direction) of superconducting wire 1. Stack 8 may have an oval shape in the cross section (x-y plane) perpendicular to the longitudinal direction (z direction) of superconducting wire 1.

Width w of superconducting wire 1 is 2 mm or less. Width w of superconducting wire 1 may be 1 mm or less. Width w of superconducting wire 1 may be 0.7 mm or less. Width w of superconducting wire 1 may be 0.5 mm or less. The width of stack 8 is 2 mm or less. The width of stack 8 may be 1 mm or less. The width of stack 8 may be 0.7 mm or less. The width of stack 8 may be 0.5 mm or less.

Superconducting wire 1 has a maximum width in central region 48 of superconducting wire 1 in the second direction (y direction). First superconducting material layer 13 is included in central region 48. Stack 8 has a maximum width in central region 48 of superconducting wire 1 in the second direction (y direction). Second superconducting material layer 23 is also included in central region 48. In the present application, central region 48 refers to a region between a pair of lines that are offset from the second centerline 46 of superconducting wire 1 by 0.25 h in the second direction (plus and minus y direction).

Particularly, superconducting wire 1 may have the maximum width in a region between a pair of lines offset from the second centerline 46 by 0.10 h in the second direction (plus and minus y direction). Stack 8 may have the maximum width in the region between the pair of lines offset from the second centerline 46 by 0.10 h in the second direction (plus and minus y direction). First superconducting material layer 13 and second superconducting material layer 23 may be included in the region between the pair of lines offset by 0.10 h in the second direction (plus and minus y direction). More particularly, superconducting wire 1 may have the maximum width in a region between a pair of lines offset from the second centerline 46 by 0.05 h in the second direction (plus and minus y direction). Stack 8 may have the maximum width in the region between the pair of lines offset from the second centerline 46 by 0.05 h in the second direction (plus and minus y direction). First superconducting material layer 13 and second superconducting material layer 23 may be included in the region between the pair of lines offset by 0.05 h in the second direction (plus and minus y direction).

Referring to FIGS. 2 to 6, one example of a method for fabricating superconducting wire 1 according to the present embodiment will be described.

Figure 2:
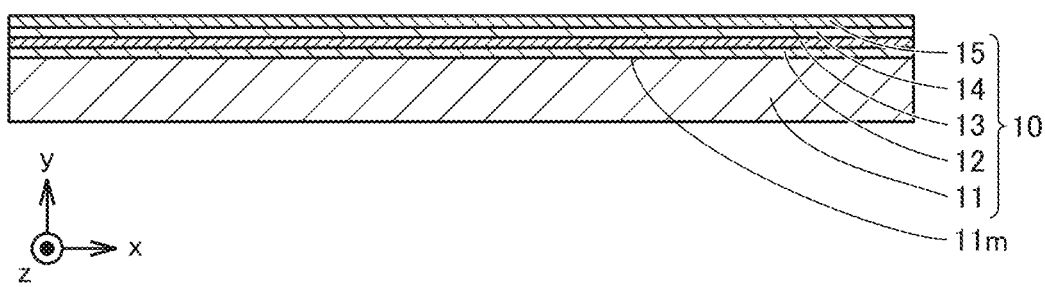
FIG. 2 is a schematic cross-sectional view showing one step in a method for fabricating the superconducting wire according to Embodiment 1.

As shown in FIG. 2, first superconducting wire portion 10 is formed on first substrate 11, the first superconducting wire portion 10 including first intermediate layer 12, first superconducting material layer 13, first protective layer 14, and first stabilizing layer 15. Specifically, first intermediate layer 12 is formed on first primary surface 11m of first substrate 11. For example, a physical vapor deposition method, such as sputtering, may be employed as a method of forming first intermediate layer 12. When first substrate 11 has no oriented crystallization in first primary surface 11m, first intermediate layer 12 having oriented crystallization may be formed by IBAD (Ion Beam Assisted Deposition).

Next, first superconducting material layer 13 is formed on first intermediate layer 12. In the present embodiment, first superconducting material layer 13 containing an RE-123-based oxide superconductor is formed on the primary surface, of first intermediate layer 12, opposite the primary surface facing first substrate 11. First superconducting material layer 13 may be formed by, for example, vapor deposition, liquid phase deposition, or a combination thereof. Examples of the vapor deposition method can include PLD (Pulsed Laser Deposition), sputtering, electron beam deposition, MOCVD (Metal-Organic Chemical Vapor Deposition), or MBE (Molecular Beam Epitaxy). Examples of deposition using a solution can include MOD (Metal Organic Deposition).

Next, first protective layer 14 is formed on first superconducting material layer 13. Specifically, first protective layer 14 is formed on the primary surface, of first superconducting material layer 13, opposite the primary surface facing first intermediate layer 12. First protective layer 14 may be formed by, for example, a physical vapor deposition method such as sputtering, or plating. In this manner, the first stack portion (11, 12, 13), composed of first substrate 11, first intermediate layer 12, and first superconducting material layer 13, is formed. The first stack portion (11, 12, 13) is annealed in oxygen atmosphere to introduce oxygen into first superconducting material layer 13.

Last, first stabilizing layer 15 is formed on first protective layer 14. First stabilizing layer 15 may be formed on first protective layer 14 by, for example, plating onto first protective layer 14 or laminating a metal foil on first protective layer 14. In this manner, first superconducting wire portion 10 is obtained.

Figure 3:
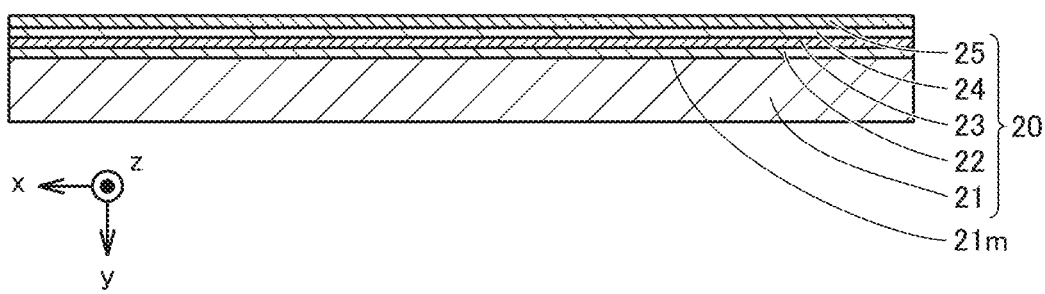
FIG. 3 is a schematic cross-sectional view showing one step in the method for fabricating the superconducting wire according to Embodiment 1.

As shown in FIG. 3, second intermediate layer 22, second superconducting material layer 23, second protective layer 24, and third stabilizing layer 25 are formed on second substrate 21, thereby forming second superconducting wire portion 20. Second superconducting wire portion 20 may be fabricated in a manner similar to that for first superconducting wire portion 10.

Figure 4:
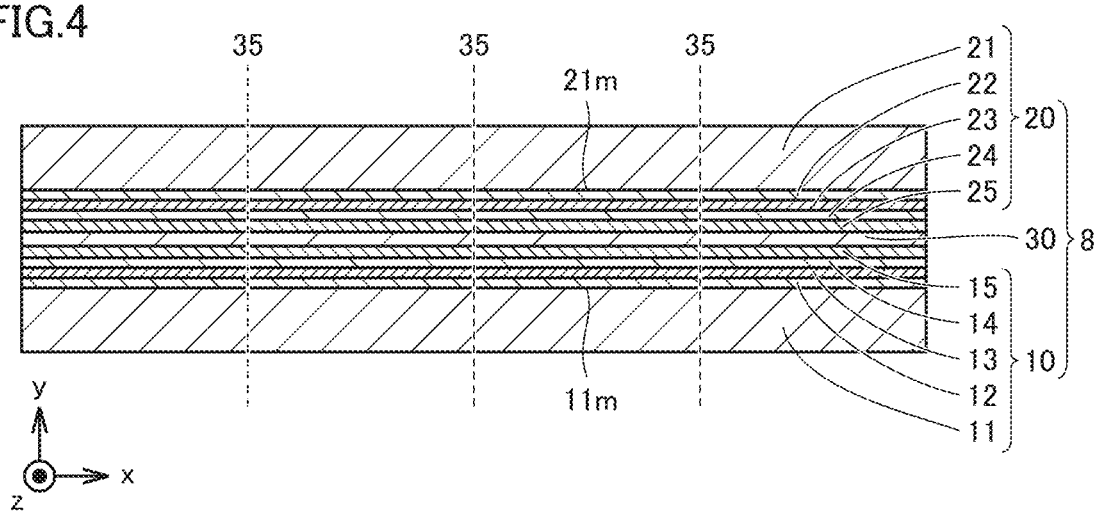
FIG. 4 is a schematic cross-sectional view showing a step following the steps shown in FIGS. 2 and 3 in the method for fabricating the superconducting wire according to Embodiment 1.
Figure 5:
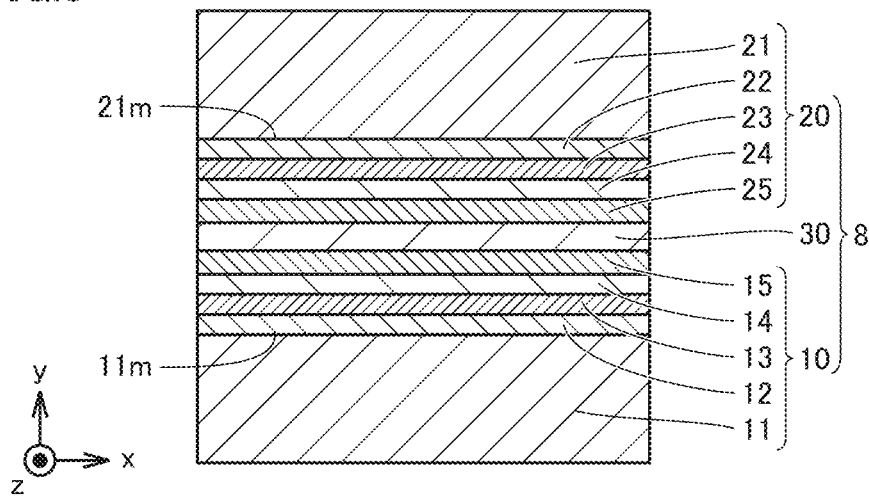
FIG. 5 is a schematic cross-sectional view showing a step following the step shown in FIG. 4 in the method for fabricating the superconducting wire according to Embodiment 1.

Referring to FIG. 4, second superconducting wire portion 20 is joined to first superconducting wire portion 10, using conductive bonding layer 30 such as a solder layer, thereby forming stack 8. Specifically, conductive bonding layer 30 is disposed between first stabilizing layer 15 and third stabilizing layer 25. Referring to FIGS. 4 and 5, stack 8 is divided by a division line 35. In one example, stack 8 may be divided by irradiating it with a laser beam. In another example, stack 8 may be divided by mechanically cutting (machine slitting) it, using a rotary blade.

Figure 6:
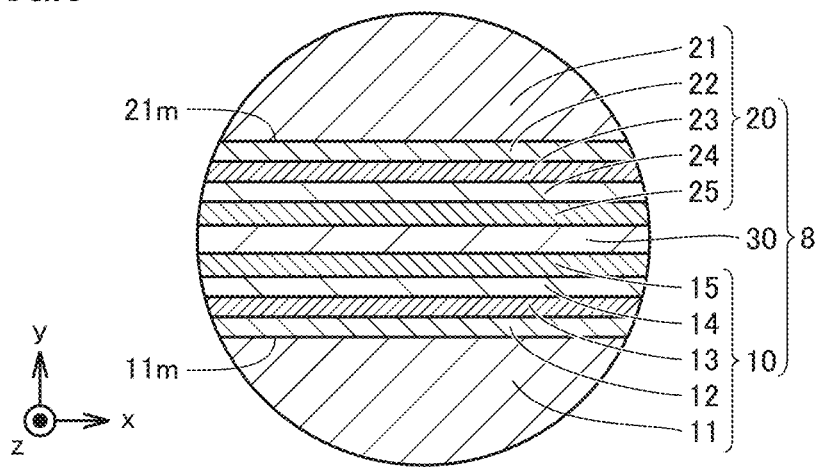
FIG. 6 is a schematic cross-sectional view showing a step following the step shown in FIG. 5 in the method for fabricating the superconducting wire according to Embodiment 1.

Referring to FIG. 6, stack 8 is machined so as to have a round shape in the cross section (x-y plane) perpendicular to the longitudinal direction (z direction) of stack 8. In this manner, stack 8 having a round cross-sectional shape as shown in FIGS. 1 and 6 is obtained.

Second stabilizing layer 40 is then formed on the outer periphery of stack 8. Second stabilizing layer 40 may be formed on the outer periphery of stack 8 by, for example, plating onto stack 8 or laminating a metal foil on stack 8. Second stabilizing layer 40 may be formed on the outer periphery of stack 8 via the underlying layer 41. In this manner, superconducting wire 1 as shown in FIG. 1 is obtained.

Actions and effects of superconducting wire 1 according to the present embodiment will be described.

Superconducting wire 1 according to the present embodiment includes stack 8 which includes: first substrate 11 having first primary surface 11m; second substrate 21 disposed opposite the first substrate 11; and first superconducting material layer 13 between first primary surface 11m and second substrate 21. Ratio w/h of width w of superconducting wire 1 to height h of superconducting wire 1 in the cross section (x-y plane) perpendicular to the longitudinal direction (z direction) of superconducting wire 1 is 0.8 or greater and 10 or less. Width w is 2 mm or less. Width w is defined as the maximum width in the first direction (x direction) in which first primary surface 11m extends in the cross section (x-y plane) perpendicular to the longitudinal direction (z direction) of superconducting wire 1. Height h is defined as a maximum height in the second direction (y direction) perpendicular to the first direction (x direction) in the cross section (x-y plane) perpendicular to the longitudinal direction (z direction) of superconducting wire 1.

Since ratio w/h of superconducting wire 1 is 0.8 or greater and 10 or less, the cross-sectional shape of superconducting wire 1 in the cross section (x-y plane) perpendicular to the longitudinal direction (z direction) of superconducting wire 1 has an improved symmetry. Superconducting wire 1 that is easy to handle can be provided. Moreover, AC loss in superconducting wire 1 decreases with a decrease in width w of superconducting wire 1. Superconducting wire 1 according to the present embodiment has width w of 2 mm or less, a narrow width. Therefore, superconducting wire 1 has a low AC loss. Furthermore, since first superconducting material layer 13 is provided between first primary surface 11m and second substrate 21, first superconducting material layer 13 can be mechanically protected by first substrate 11 and second substrate 21.

Superconducting wire 1 according to the present embodiment has the maximum width in central region 48 of superconducting wire 1 in the second direction (y direction). First superconducting material layer 13 is included in central region 48. Therefore, the ratio of the cross-sectional area of first superconducting material layer 13 to the cross-sectional area of superconducting wire 1 in the cross section (x-y plane) perpendicular to the longitudinal direction (z direction) of superconducting wire 1 is great. Superconducting wire 1 has high critical current Ic.

Moreover, since first superconducting material layer 13 is included in central region 48, an amount of machining of first superconducting material layer 13 in the machining process for stack 8 shown in FIG. 6 can be reduced. Degradation of first superconducting material layer 13 in crystallinity and a decrease in cross-sectional area of first superconducting material layer 13 can be inhibited. Superconducting wire 1 has high critical current Ic.

In superconducting wire 1 according to the present embodiment, stack 8 further includes conductive bonding layer 30 between first superconducting material layer 13 and second substrate 21. Conductive bonding layer 30 serves as a bypass to which a current flow in first superconducting material layer 13 in the superconducting state commutates upon transition of first superconducting material layer 13 to the normal conducting state. Superconducting wire 1 can be prevented from being damaged upon transition of first superconducting material layer 13 from the superconducting state to the normal conducting state.

In superconducting wire 1 according to the present embodiment, stack 8 further includes first stabilizing layer 15 between first superconducting material layer 13 and second substrate 21. First stabilizing layer 15 serves as a bypass to which a current flow in first superconducting material layer 13 in the superconducting state commutates upon transition of first superconducting material layer 13 to the normal conducting state. Superconducting wire 1 can be prevented from being damaged upon transition of first superconducting material layer 13 from the superconducting state to the normal conducting state.

In superconducting wire 1 according to the present embodiment, second substrate 21 has second primary surface 21m opposite the first primary surface 11m. Stack 8 further includes second superconducting material layer 23 between first primary surface 11m and second primary surface 21m. Therefore, the ratio of the cross-sectional area of the superconducting material layer (first superconducting material layer 13 and second superconducting material layer 23) to the cross-sectional area of superconducting wire 1 in the cross section (x-y plane) perpendicular to the longitudinal direction (z direction) of superconducting wire 1 is great. Superconducting wire 1 has high critical current Ic. Since first superconducting material layer 13 and second superconducting material layer 23 are disposed between first primary surface 11m and second primary surface 21m opposite the first primary surface 11m, first superconducting material layer 13 and second superconducting material layer 23 can be mechanically protected by first substrate 11 and second substrate 21.

Superconducting wire 1 according to the present embodiment has the maximum width in central region 48 of superconducting wire 1 in the second direction (y direction). First superconducting material layer 13 and second superconducting material layer 23 are included in central region 48. Therefore, the ratio of the cross-sectional area of the superconducting material layer (first superconducting material layer 13 and second superconducting material layer 23) to the cross-sectional area of superconducting wire 1 in the cross section (x-y plane) perpendicular to the longitudinal direction (z direction) of superconducting wire 1 is great. Superconducting wire 1 has high critical current Ic.

Moreover, since first superconducting material layer 13 and second superconducting material layer 23 are included in central region 48, an amount of machining of first superconducting material layer 13 and second superconducting material layer 23 in the machining process for stack 8 shown in FIG. 6 can further be reduced. Degradation of first superconducting material layer 13 and second superconducting material layer 23 in crystallinity and decrease in cross-sectional area of first superconducting material layer 13 and second superconducting material layer 23 can further be inhibited. Superconducting wire 1 has high critical current Ic.

In superconducting wire 1 according to the present embodiment, stack 8 further includes conductive bonding layer 30 between first superconducting material layer 13 and second superconducting material layer 23. Conductive bonding layer 30 serves as a bypass to which a current flow in at least one of first superconducting material layer 13 and second superconducting material layer 23 commutates upon transition of the at least one of first superconducting material layer 13 and second superconducting material layer 23 from the superconducting state to the normal conducting state. Superconducting wire 1 can be prevented from being damaged upon transition of the at least one of first superconducting material layer 13 and second superconducting material layer 23 from the superconducting state to the normal conducting state.

In superconducting wire 1 according to the present embodiment, stack 8 further includes first stabilizing layer 15 between first superconducting material layer 13 and second superconducting material layer 23. First stabilizing layer 15 serves as a bypass to which a current flow in at least one of first superconducting material layer 13 and second superconducting material layer 23 in the superconducting state commutates upon transition of the at least one of first superconducting material layer 13 and second superconducting material layer 23 to the normal conducting state. Superconducting wire 1 can be prevented from being damaged upon transition of the at least one of first superconducting material layer 13 and second superconducting material layer 23 from the superconducting state to the normal conducting state.

Superconducting wire 1 according to the present embodiment further includes second stabilizing layer 40 for covering the outer periphery of stack 8. Second stabilizing layer 40 serves as a bypass to which a current flow in at least one of first superconducting material layer 13 and second superconducting material layer 23 in the superconducting state commutates upon transition of the at least one of first superconducting material layer 13 and second superconducting material layer 23 to the normal conducting state. Superconducting wire 1 can be prevented from being damaged upon transition of the at least one of first superconducting material layer 13 and second superconducting material layer 23 from the superconducting state to the normal conducting state.

In superconducting wire 1 according to the present embodiment, ratio w/h may be 0.9 or greater and 7 or less, and width w may be 1 mm or less. The cross-sectional shape of superconducting wire 1 in the cross section (x-y plane) perpendicular to the longitudinal direction (z direction) of superconducting wire 1 further has an improved symmetry. Superconducting wire 1 that is easy to handle can be provided. Moreover, since superconducting wire 1 has a further narrow width, superconducting wire 1 has a low AC loss.

In superconducting wire 1 according to the present embodiment, ratio w/h may be 1 or greater and 2 or less, and width w may be 0.7 mm or less. The cross-sectional shape of superconducting wire 1 in the cross section (x-y plane) perpendicular to the longitudinal direction (z direction) of superconducting wire 1 has a further improved symmetry. Superconducting wire 1 that is easy to handle can be provided. Moreover, since superconducting wire 1 has a further narrow width, superconducting wire 1 has a low AC loss.

In the cross section (x-y plane) perpendicular to the longitudinal direction (z direction) of superconducting wire 1, superconducting wire 1 according to the present embodiment has a shape that is line symmetric about the first centerline 44 of superconducting wire 1 in the first direction (x direction) and line symmetric about the second centerline 46 of superconducting wire 1 in the second direction (y direction). The cross-sectional shape of superconducting wire 1 in the cross section (x-y plane) perpendicular to the longitudinal direction (z direction) of superconducting wire 1 has a further improved symmetry. Superconducting wire 1 that is easy to handle can be provided.

Superconducting wire 1 according to the present embodiment has an oval shape, and particularly a round shape in the cross section (x-y plane) perpendicular to the longitudinal direction (z direction) of superconducting wire 1. The cross-sectional shape of superconducting wire 1 in the cross section (x-y plane) perpendicular to the longitudinal direction (z direction) of superconducting wire 1 has a further improved symmetry. Superconducting wire 1 that is easy to handle can be provided.

Embodiment 2

Figure 7:
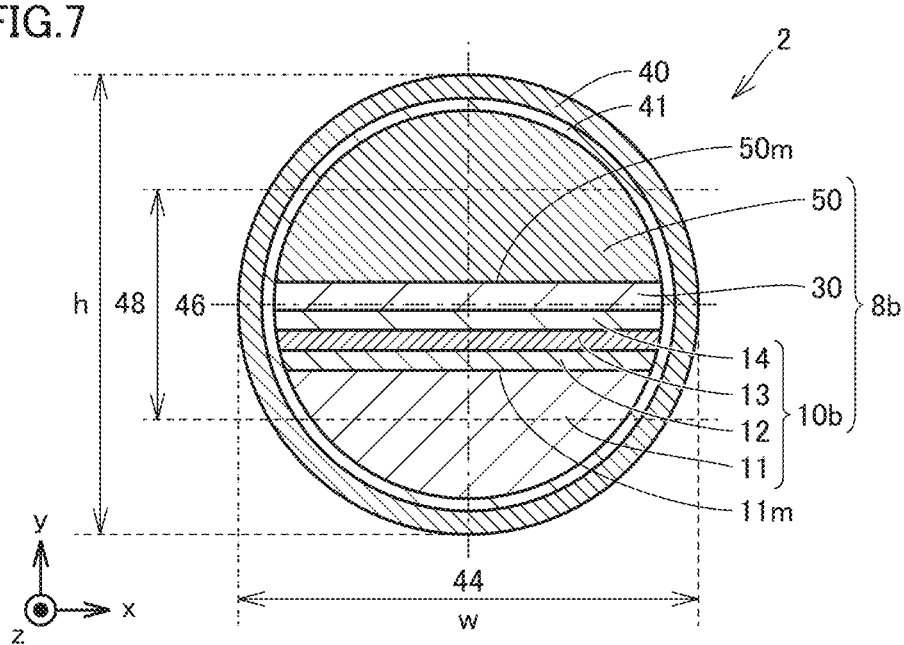
FIG. 7 is a schematic cross-sectional view of a superconducting wire according to Embodiment 2 in a cross section perpendicular to the longitudinal direction of the superconducting wire.

Referring to FIG. 7, a superconducting wire 2 according to Embodiment 2 will be described. Superconducting wire 2 according to the present embodiment has a configuration similar to that of superconducting wire 1 according to Embodiment 1, and differs in the following points. Superconducting wire 2 according to the present embodiment includes a stack 8b. Stack 8b includes a first superconducting wire portion 10b, a second substrate 50, and a conductive bonding layer 30 between first superconducting wire portion 10b and second substrate 50.

In superconducting wire 2 according to the present embodiment, second substrate 50, which is a stabilizing substrate, is used instead of second superconducting wire portion 20 according to Embodiment 1. Second substrate 50 has a second primary surface 50m. Second substrate 50, along with first protective layer 14, serves as a bypass to which a current flow in first superconducting material layer 13 in a superconducting state commutates upon transition of first superconducting material layer 13 to a normal conducting state. Second substrate 50, along with first substrate 11, mechanically protects first intermediate layer 12, first superconducting material layer 13, and first protective layer 14. Second substrate 50 may be a substrate made of a metal material that has good electrical conductivity. Preferably, the material comprising second substrate 50 is copper (Cu) or a copper alloy, for example.

Second substrate 50 may have a thickness of, but not particularly limited to, 30 µm or greater, and particularly 50 µm or greater. Considering the productivity and cost of second substrate 50, second substrate 50 may have a thickness of 1 mm or less, and particularly 200 µm or less. Second substrate 50 which is a stabilizing substrate may have a thickness similar to first substrate 11 or second substrate 21 according to Embodiment 1. Second substrate 50 which is a stabilizing substrate has a greater thickness than first stabilizing layer 15 and third stabilizing layer 25 according to Embodiment 1.

First superconducting wire portion 10b includes first substrate 11, first intermediate layer 12, first superconducting material layer 13, and first protective layer 14. Since superconducting wire 2 according to the present embodiment includes second substrate 50 which is a stabilizing substrate, first superconducting wire portion 10b may not include first stabilizing layer 15 according to Embodiment 1.

Referring to FIGS. 8 to 12, one example of a method for fabricating superconducting wire 2 according to the present embodiment will be described.

Figure 8:
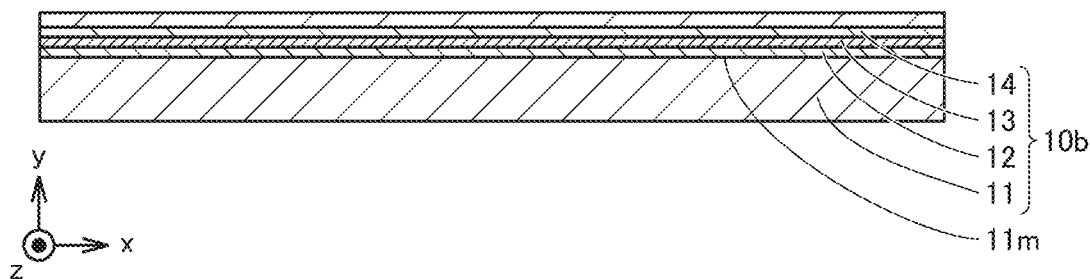
FIG. 8 is a schematic cross-sectional view showing one step in a method for fabricating the superconducting wire according to Embodiment 2.
Figure 9:
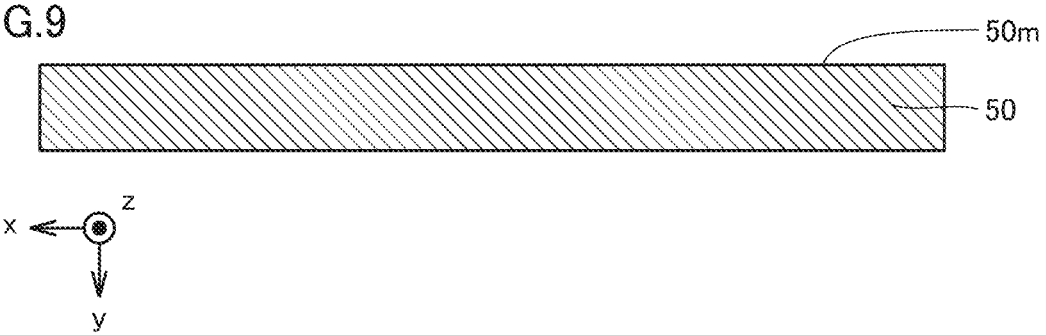
FIG. 9 is a schematic cross-sectional view showing one step in the method for fabricating the superconducting wire according to Embodiment 2.

As shown in FIG. 8, first intermediate layer 12, first superconducting material layer 13, and first protective layer 14 are formed on first substrate 11. In this manner, first superconducting wire portion 10b is obtained. First superconducting wire portion 10b according to the present embodiment may be fabricated in a manner similar to that for first superconducting wire portion 10 according to Embodiment 1. As shown in FIG. 9, second substrate 50 which is a stabilizing substrate is prepared.

Figure 10:
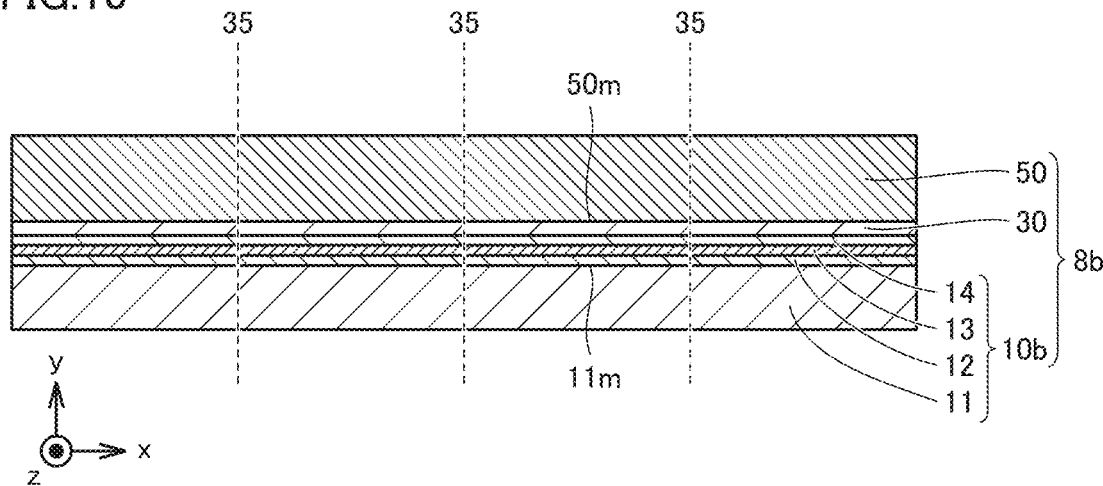
FIG. 10 is a schematic cross-sectional view showing a step following the steps shown in FIGS. 8 and 9 in the method for fabricating the superconducting wire according to Embodiment 2.
Figure 11:
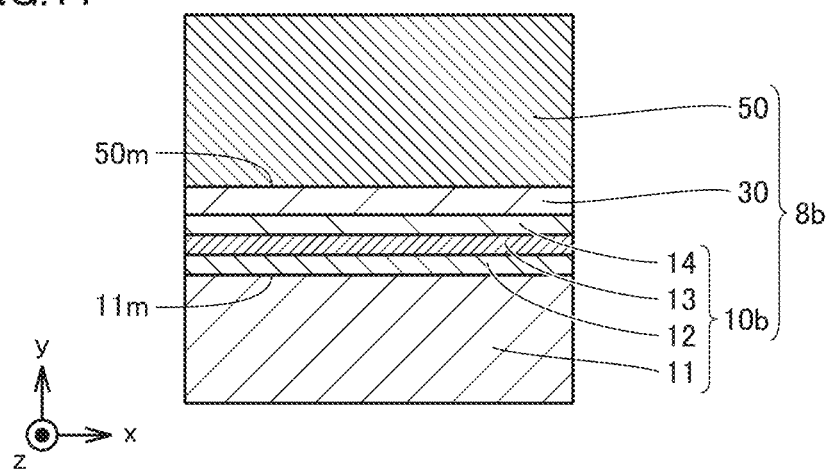
FIG. 11 is a schematic cross-sectional view showing a step following the step shown in FIG. 10 in the method for fabricating the superconducting wire according to Embodiment 2.

As shown in FIG. 10, second substrate 50 is joined to first superconducting wire portion 10b, using conductive bonding layer 30 such as a solder layer, thereby forming stack 8b. Conductive bonding layer 30 is disposed between first stabilizing layer 15 and second primary surface 50m of second substrate 50. As shown in FIGS. 10 and 11, stack 8b is divided by a division line 35. In one example, stack 8b may be divided by being irradiated with a laser beam. In another example, stack 8 may be divided by mechanically cutting (machine slitting) it, using a rotary blade.

Figure 12:
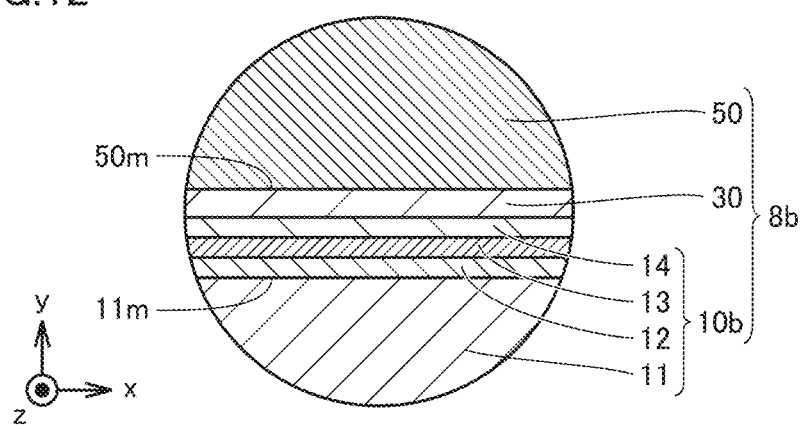
FIG. 12 is a schematic cross-sectional view showing a step following the step shown in FIG. 11 in the method for fabricating the superconducting wire according to Embodiment 2.

Referring to FIG. 12, stack 8b is machined so as to have a round shape in a cross section (x-y plane) perpendicular to the longitudinal direction (z direction) of stack 8b. In this manner, stack 8b as shown in FIGS. 7 and 12 is obtained.

Second stabilizing layer 40 is then formed on the outer periphery of stack 8b. Second stabilizing layer 40 may be formed on the outer periphery of stack 8b by, for example, plating onto stack 8b or laminating a metal foil on stack 8b. Second stabilizing layer 40 may be formed on the outer periphery of stack 8b via the underlying layer 41. In this manner, superconducting wire 2 having a round cross-sectional shape as shown in FIG. 7 is obtained.

Actions and effects of superconducting wire 2 according to the present embodiment will be described. Superconducting wire 2 according to the present embodiment yields effects similar to those of superconducting wire 1 according to Embodiment 1, and differs in the following points.

In superconducting wire 2 according to the present embodiment, second substrate 50 is a stabilizing substrate. Second substrate 50 which is stabilizing substrate serves as a bypass to which a current flow in at least one of first superconducting material layer 13 and second superconducting material layer 23 in the superconducting state commutates upon transition of the at least one of first superconducting material layer 13 and second superconducting material layer 23 to the normal conducting state. According to superconducting wire 2 of the present embodiment, superconducting wire 2 can be prevented from being damaged upon transition of the at least one of first superconducting material layer 13 and second superconducting material layer 23 from the superconducting state to the normal conducting state.

Embodiment 3

Figure 13:
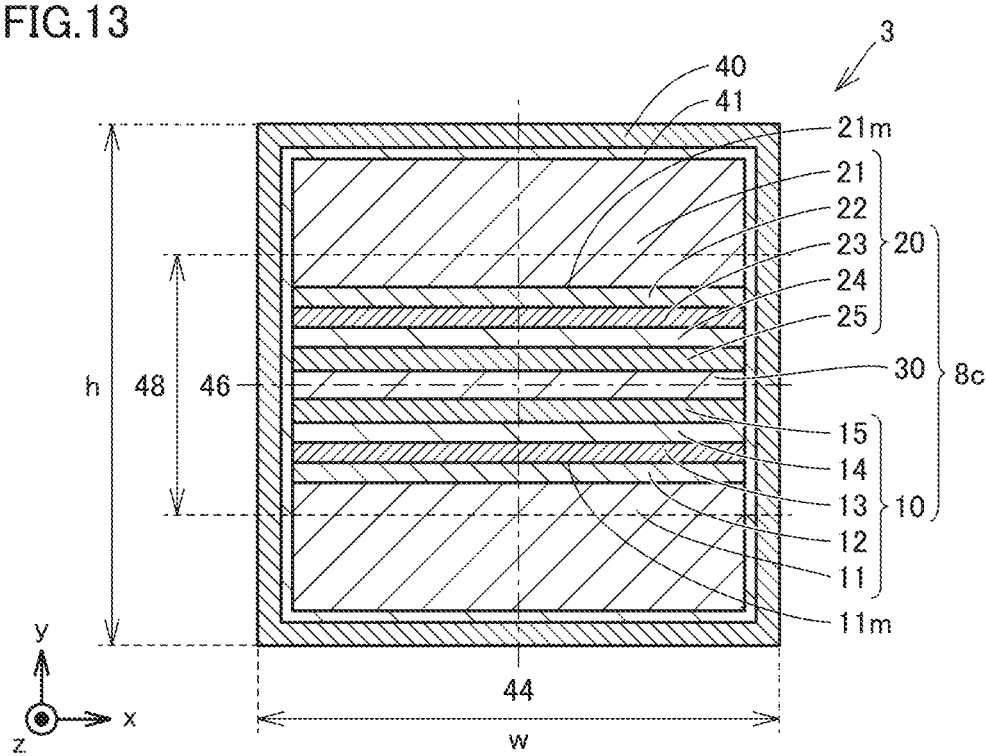
FIG. 13 is a schematic cross-sectional view of a superconducting wire according to Embodiment 3 in a cross section perpendicular to the longitudinal direction of the superconducting wire.

Referring to FIG. 13, a superconducting wire 3 according to Embodiment 3 will be described. Superconducting wire 3 according to the present embodiment has a configuration similar to that of superconducting wire 1 according to Embodiment 1, and differs in the following points.

Superconducting wire 3 according to the present embodiment has a polygonal shape, particularly a rhombus shape, and more particularly a square shape in a cross section (x-y plane) perpendicular to the longitudinal direction (z direction) of superconducting wire 3. Superconducting wire 3 includes a stack 8c. Stack 8c has a polygonal shape, particularly a rhombus shape, and more particularly a square shape in the cross section (x-y plane) perpendicular to the longitudinal direction (z direction) of superconducting wire 3.

One example of a method for fabricating superconducting wire 3 according to the present embodiment will be described. The method for fabricating superconducting wire 3 according to the present embodiment is similar to the method for fabricating superconducting wire 1 according to Embodiment 1, and differs in the following points. Stack 8c is machined so as to have a polygonal shape, and particularly a square shape in the cross section (x-y plane) perpendicular to the longitudinal direction (z direction) of stack 8c. The machining process for stack 8c as shown in FIG. 6 may be omitted from the method for fabricating superconducting wire 3 according to present embodiment.

Actions and effects of superconducting wire 3 according to the present embodiment will be described. Superconducting wire 3 according to the present embodiment yields the following effects, in addition to the effects of superconducting wire 1 according to Embodiment 1.

Superconducting wire 3 according to the present embodiment has a polygonal shape in the cross section (x-y plane) perpendicular to the longitudinal direction (z direction) of superconducting wire 3. Superconducting wire 3 has a cross-sectional shape that can be readily formed by machining. Superconducting wire 3 has a cross-sectional shape which allows for omission of a machining. Since the curved-surface processing step for superconducting wire 3 can be omitted, superconducting wire 3 according to the present embodiment has a shape that allows for reduction of the manufacturing cost for superconducting wire 3.

Superconducting wire 3 according to the present embodiment has a rhombus shape, and particularly a square shape. The cross-sectional shape of superconducting wire 3 in the cross section (x-y plane) perpendicular to the longitudinal direction (z direction) of superconducting wire 3 has a further improved symmetry. Superconducting wire 3 that is easy to handle can be provided.

Embodiment 4

Figure 14:
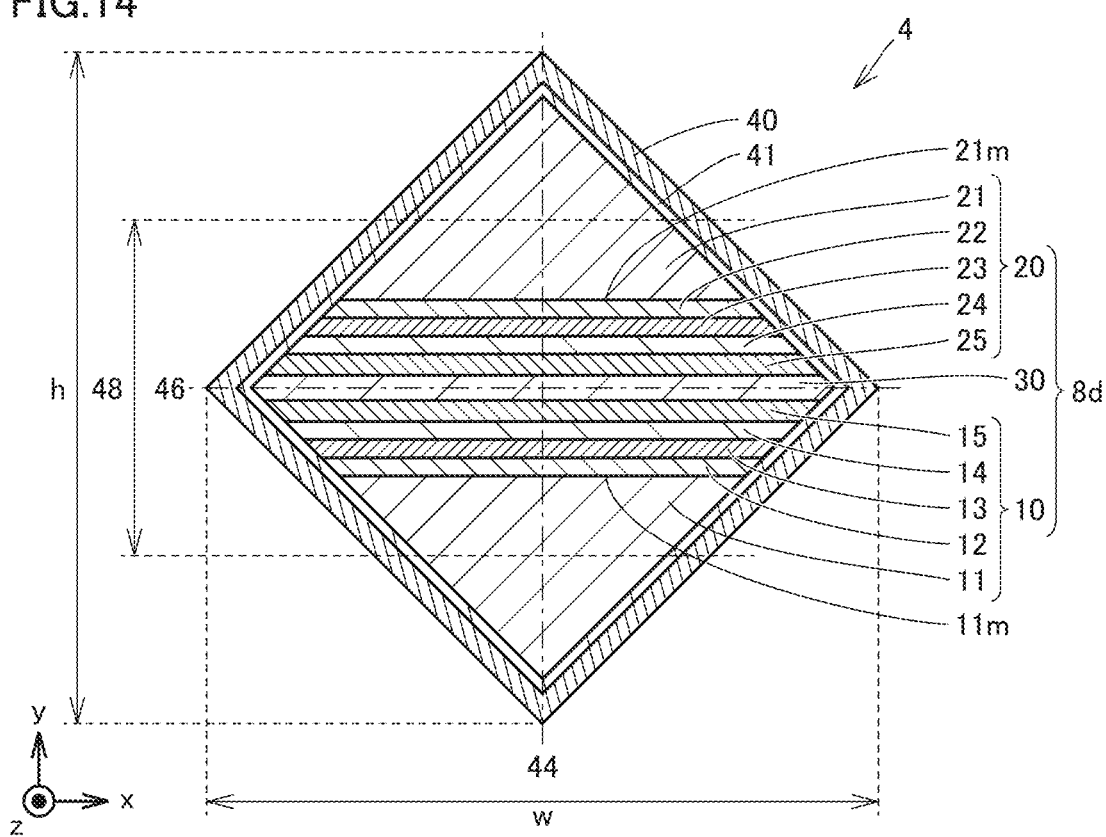
FIG. 14 is a schematic cross-sectional view of a superconducting wire according to Embodiment 4 in a cross section perpendicular to the longitudinal direction of the superconducting wire.

Referring to FIG. 14, a superconducting wire 4 according to Embodiment 4 will be described. Superconducting wire 4 according to the present embodiment has a configuration similar to that of superconducting wire 3 according to Embodiment 3, and differs in the following points.

Superconducting wire 4 according to the present embodiment has a maximum width in a central region 48 of superconducting wire 4 in the second direction (y direction). Superconducting wire 4 includes a stack 8d. Stack 8d has a maximum width in central region 48 of superconducting wire 4 in the second direction (y direction). A first superconducting material layer 13 and a second superconducting material layer 23 are included in central region 48.

Particularly, superconducting wire 4 may have the maximum width in a region between a pair of lines offset from the second centerline 46 by 0.10 h in the second direction (plus and minus y direction). Stack 8d may have the maximum width in a region between a pair of lines offset from the second centerline 46 by 0.10 h in the second direction (plus and minus y direction). First superconducting material layer 13 and second superconducting material layer 23 may be included in the resin between the pair of lines offset by 0.10 h in the second direction (plus and minus y direction). More particularly, superconducting wire 4 may have the maximum width in a region between a pair of lines offset from the second centerline 46 by 0.05 h in the second direction (plus and minus y direction). Stack 8d may have the maximum width in a region between a pair of lines offset from the second centerline 46 by 0.05 h in the second direction (plus and minus y direction). First superconducting material layer 13 and second superconducting material layer 23 may be included in the region between the pair of lines offset by 0.05 h in the second direction (plus and minus y direction).

A method for fabricating superconducting wire 4 according to the present embodiment is similar to the method for fabricating superconducting wire 3 according to Embodiment 3.

Actions and effects of superconducting wire 4 according to the present embodiment will be described. Superconducting wire 4 according to the present embodiment yields the following effects, in addition to the effects of superconducting wire 3 according to Embodiment 3.

Superconducting wire 4 according to the present embodiment has the maximum width in central region 48 of superconducting wire 4 in the second direction (y direction). First superconducting material layer 13 and second superconducting material layer 23 are included in central region 48. Therefore, the cross-sectional area of the superconducting material layer (first superconducting material layer 13 and second superconducting material layer 23) to the cross-sectional area of superconducting wire 4 in the cross section (x-y plane) perpendicular to the longitudinal direction (z direction) of superconducting wire 4 is great. Superconducting wire 4 has high critical current Ic.

Moreover, since first superconducting material layer 13 and second superconducting material layer 23 are included in central region 48, an amount of machining of first superconducting material layer 13 and second superconducting material layer 23 in the machining process for stack 8d as shown in FIG. 6 can further be reduced. Degradation of first superconducting material layer 13 and second superconducting material layer 23 in crystallinity and decrease in cross-sectional area of first superconducting material layer 13 and second superconducting material layer 23 can further be inhibited. Superconducting wire 4 has high critical current Ic.

Embodiment 5

Figure 15:
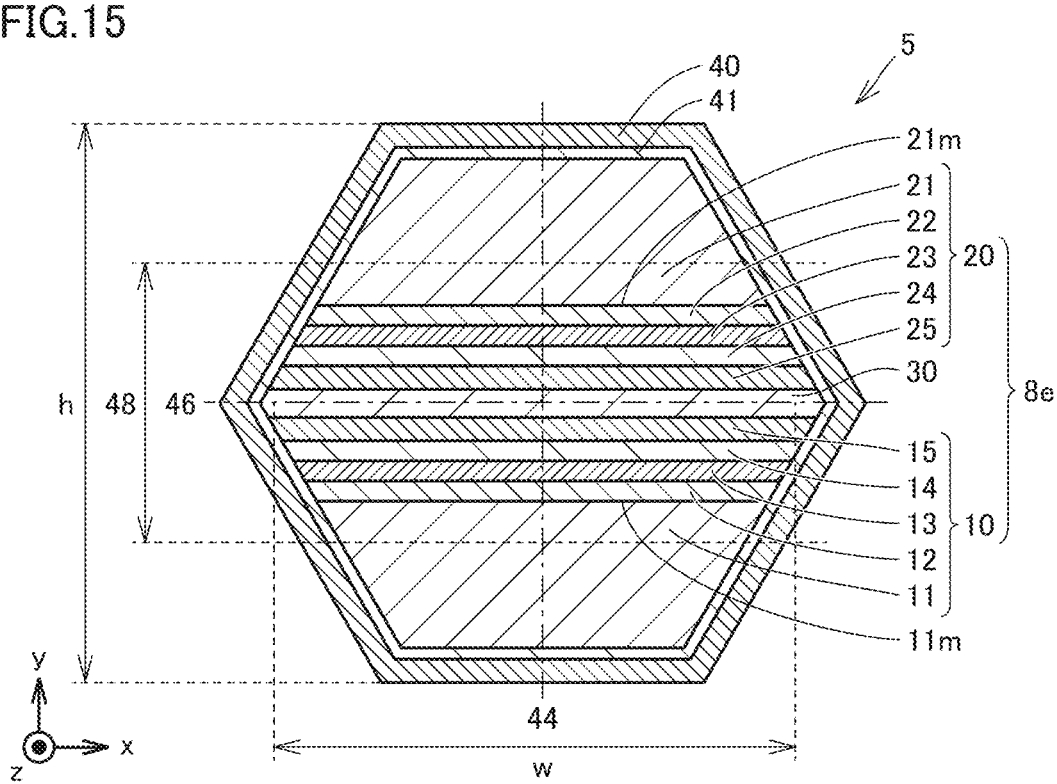
FIG. 15 is a schematic cross-sectional view of a superconducting wire according to Embodiment 5 in a cross section perpendicular to the longitudinal direction of the superconducting wire.

Referring to FIG. 15, a superconducting wire 5 according to Embodiment 5 will be described. Superconducting wire 5 according to the present embodiment has a configuration similar to that of superconducting wire 4 according to Embodiment 4, and differs in the following points.

Superconducting wire 5 according to the present embodiment has a polygonal shape, and particularly a regular hexagonal shape in a cross section (x-y plane) perpendicular to the longitudinal direction (z direction) of superconducting wire 5. Superconducting wire 5 includes a stack 8e. Stack 8e has a polygonal shape, and particularly a regular hexagonal shape in the cross section (x-y plane) perpendicular to the longitudinal direction (z direction) of superconducting wire 5.

A method for fabricating superconducting wire 5 according to the present embodiment is similar to the method for fabricating superconducting wire 4 according to Embodiment 4.

Actions and effects of superconducting wire 5 according to the present embodiment will be described. Superconducting wire 5 according to the present embodiment yields the following effects, in addition to the effects of superconducting wire 4 according to Embodiment 4.

Superconducting wire 5 according to the present embodiment has a polygonal shape, and particularly a regular hexagonal shape in the cross section (x-y plane) perpendicular to the longitudinal direction (z direction) of superconducting wire 5. Therefore, in superconducting wire 5 according to the present embodiment, the ratio of the cross-sectional area of the superconducting material layer (first superconducting material layer 13 and second superconducting material layer 23) to the cross-sectional area of superconducting wire 5 in the cross section (x-y plane) perpendicular to the longitudinal direction (z direction) of superconducting wire 5 is great. Superconducting wire 5 has a high critical current Ic.

Moreover, according to superconducting wire 5 of the present embodiment, an amount of machining of first superconducting material layer 13 and second superconducting material layer 23 in the machining process for stack 8e as shown in FIG. 6 can further be reduced. Degradation of first superconducting material layer 13 and second superconducting material layer 23 in crystallinity and decrease in cross-sectional area of first superconducting material layer 13 and second superconducting material layer 23 can further be inhibited. Superconducting wire 5 has high critical current Ic.

The presently disclosed embodiments should be considered in all aspects illustrative and not restrictive. Unless otherwise indicated herein or clearly contradicted by context, at least two of the presently disclosed embodiments may be combined. The scope of the present invention is defined by the appended claims, rather than by the embodiments described above, and all changes which come within the meaning and range of equivalency of the appended claims are intended to be included within the scope of the present invention.

REFERENCE SIGNS LIST 1, 2, 3, 4, 5 superconducting wire; 8, 8b, 8c, 8d, 8e stack; 10, 10b first superconducting wire portion; 11 first substrate; 11m first primary surface; 12 first intermediate layer; 13 first superconducting material layer; 14 first protective layer; 15 first stabilizing layer; 20 second superconducting wire portion; 21, 50 second substrate; 21m, 50m second primary surface; 22 second intermediate layer; second superconducting material layer; 24 second protective layer; 25 third stabilizing layer; 30 conductive bonding layer; 35 division line; 40 second stabilizing layer; 41 underlying layer; 44 first centerline; and 46 second centerline; 48 central region.

The invention claimed is:
1. A superconducting wire, comprising
a stack which includes:
a first substrate having a first primary surface;
a second substrate disposed opposite the first substrate; and
a first superconducting material layer between the first primary surface and the second substrate,
the superconducting wire having a ratio w/h of 0.8 or greater and 10 or less, the ratio w/h being a ratio of a width w of the superconducting wire to a height h of the superconducting wire in a cross section perpendicular to a longitudinal direction of the superconducting wire,
the width w being 2 mm or less,
the width w being defined as a maximum width of the superconducting wire in a first direction in which the first primary surface extends in the cross section,
the height h being defined as a maximum height of the superconducting wire in a second direction perpendicular to the first direction in the cross section.
2. The superconducting wire according to claim 1, wherein
the superconducting wire has the maximum width in a central region of the superconducting wire in the second direction, and
the first superconducting material layer is included in the central region.
3. The superconducting wire according to claim 1, wherein
the stack further includes a conductive bonding layer between the first superconducting material layer and the second substrate.
4. The superconducting wire according to claim 1, wherein
the stack further includes a first stabilizing layer between the first superconducting material layer and the second substrate.
5. The superconducting wire according to claim 1, wherein
the second substrate has a second primary surface opposite the first primary surface, and
the stack further includes a second superconducting material layer between the first primary surface and the second primary surface.
6. The superconducting wire according to claim 5, wherein the superconducting wire has the maximum width in a central region of the superconducting wire in the second direction, and the first superconducting material layer and the second superconducting material layer are included in the central region.

7. The superconducting wire according to claim 5, wherein the stack further includes a conductive bonding layer between the first superconducting material layer and the second superconducting material layer.

8. The superconducting wire according to claim 5, wherein the stack further includes a first stabilizing layer between the first superconducting material layer and the second superconducting material layer.

9. The superconducting wire according to claim 1, wherein the second substrate is a stabilizing substrate.

10. The superconducting wire according to claim 1, further comprising a second stabilizing layer for covering an outer periphery of the stack.

11. The superconducting wire according to claim 1, wherein the ratio w/h is 0.9 or greater and 7 or less, and the width w is 1 mm or less.

12. The superconducting wire according to claim 1, wherein the ratio w/h is 1 or greater and 2 or less, and the width w is 0.7 mm or less.

13. The superconducting wire according to claim 1, wherein, in the cross section, the superconducting wire has a shape that is line symmetric about a first centerline of the superconducting wire in the first direction and line symmetric about a second centerline of the superconducting wire in the second direction.

14. The superconducting wire according to claim 1, wherein the superconducting wire has any of a round shape, an oval, and a polygonal shape in the cross section.

15. The superconducting wire according to claim 1, wherein the superconducting wire has any of a round shape, a square shape, a rhombus shape, and a regular hexagonal shape in the cross section.

* * * * *